United States Patent
Kim et al.

(10) Patent No.: US 10,037,949 B1
(45) Date of Patent: Jul. 31, 2018

(54) SEMICONDUCTOR PACKAGE AND FABRICATING METHOD THEREOF

(71) Applicant: Amkor Technology, Inc., Tempe, AZ (US)

(72) Inventors: Hee Sung Kim, Jeollanam-do (KR); Yeoung Beom Ko, Gwangju (KR); Dae Byoung Kang, Seoul (KR); Jae Jin Lee, Seoul (KR); Joon Dong Kim, Gwang-ju (KR); Dong Jean Kim, Gwangju (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/447,831

(22) Filed: Mar. 2, 2017

(51) Int. Cl.

| | |
|---|---|
| H01L 23/552 | (2006.01) |
| H01L 21/78 | (2006.01) |
| H01L 21/56 | (2006.01) |
| H01L 21/683 | (2006.01) |
| H01L 23/00 | (2006.01) |
| H01L 23/31 | (2006.01) |
| H01L 25/16 | (2006.01) |

(52) U.S. Cl.
CPC .......... H01L 23/552 (2013.01); H01L 21/561 (2013.01); H01L 21/6835 (2013.01); H01L 21/78 (2013.01); H01L 23/3128 (2013.01); H01L 24/11 (2013.01); H01L 24/14 (2013.01); H01L 25/165 (2013.01); *H01L 2221/68327* (2013.01); *H01L 2221/68345* (2013.01); *H01L 2221/68359* (2013.01); *H01L 2224/0401* (2013.01)

(58) Field of Classification Search
CPC . H01L 23/36; H01L 23/5389; H01L 23/3135; H01L 23/562; H01L 23/13; H01L 23/3737; H01L 23/49822; H01L 23/49827; H01L 23/552; H01L 21/561; H01L 21/568; H01L 21/78
See application file for complete search history.

(56) References Cited

U.S. PATENT DOCUMENTS

| | | | |
|---|---|---|---|
| 2012/0300412 A1* | 11/2012 | Song | H01L 23/552 361/728 |
| 2016/0013148 A1* | 1/2016 | Lin | H01L 23/552 257/773 |
| 2016/0035680 A1* | 2/2016 | Wu | H01L 23/552 257/659 |
| 2016/0093576 A1* | 3/2016 | Chiu | H01L 21/561 257/659 |
| 2017/0186698 A1* | 6/2017 | Dimayuga | H01L 21/563 |

\* cited by examiner

*Primary Examiner* — Thanhha Pham
(74) *Attorney, Agent, or Firm* — McAndrews, Held & Malloy, Ltd.

(57) ABSTRACT

A semiconductor package that includes EMI shielding and a fabricating method thereof are disclosed. In one embodiment, the fabricating method of a semiconductor package includes forming a substrate, attaching semiconductor devices to a top portion of the substrate, encapsulating the semiconductor devices using an encapsulant, forming a trench in the encapsulant, and forming a shielding layer on a surface of the encapsulant.

20 Claims, 12 Drawing Sheets

SEMICONDUCTOR PACKAGE AND FABRICATING METHOD THEREOF

TECHNICAL FIELD

Certain embodiments of the disclosure relate to a semiconductor package, and more particularly to forming a semiconductor package comprising multiple semiconductor dies.

BACKGROUND

Various electronic apparatuses may comprise semiconductor devices having various structures as well as electronic devices for exchanging a variety of signals, where the semiconductor devices and the electronic devices emit electromagnetic waves during operation.

The electromagnetic waves may interfere with operation of the semiconductor devices and the electronic devices because these devices may be mounted very closely together on a motherboard. Accordingly, there is a need for structures and/or methods for shielding the electromagnetic waves.

Further limitations and disadvantages of conventional and traditional approaches will become apparent to one of skill in the art, through comparison of such systems with some aspects of the present disclosure as set forth in the remainder of the present application with reference to the drawings.

SUMMARY

A semiconductor package and a fabricating method thereof are substantially shown in and/or described in connection with at least one of the figures, and are set forth more completely in the claims.

Various advantages, aspects, and novel features of the present disclosure, as well as details of an illustrated embodiment(s) thereof, will be more fully understood from the following description and drawings

DETAILED DESCRIPTION

Figure 1A:
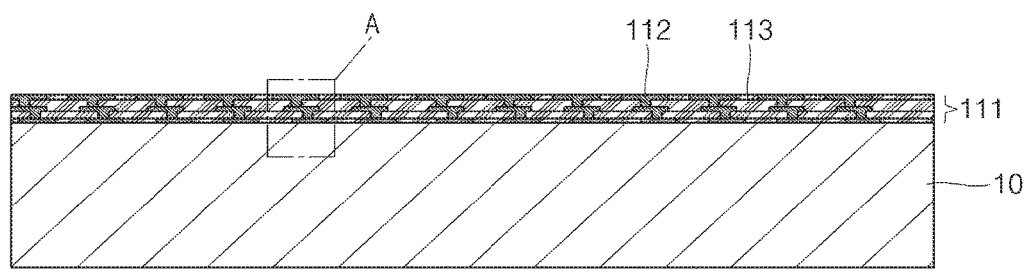
FIGS. 1A to 1J are cross-sectional views sequentially illustrating process steps of a fabricating method of a semiconductor package according to an embodiment of the present disclosure.

The present embodiments should not be construed as being limited to the descriptions set forth herein. Rather, these embodiments are provided as examples (such as, without limitation, variations of the surfaces onto which a shape is projected, the angle of incidence of the projection onto such a surface, the nature and configuration(s) of the elements projected, and the like) so that this disclosure will be thorough and complete and will fully convey the concept of the present embodiments to one of ordinary skill in the art. The appended claims illustrate some of the embodiments of the present disclosure.

In the following discussion, the phrases "for example," "e.g.," and "exemplary" are non-limiting and are generally synonymous with "by way of example and not a limitation," "for example and not a limitation," and the like.

As utilized herein, "and/or" means any one or more of the items in the list joined by "and/or." As an example, "x and/or y" means any element of the three-element set {(x), (y), (x, y)}. That is, "x and/or y" means "one or both of x and y." As another example, "x, y, and/or z" means any element of the seven-element set {(x), (y), (z), (x, y), (x, z), (y, z), (x, y, z)}. That is, "x, y, and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component, or a first section could be termed a second element, a second component, or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example an electronic device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, and the like, unless explicitly indicated otherwise. For example, if element A is said to be coupled to element B, element A may be indirectly coupled to element B through an intermediate structure, element A may be directly coupled to element B, and the like.

In the drawings, the dimensions of devices, structures, layers, regions, and the like, (e.g., absolute and/or relative dimensions) may be exaggerated for clarity. While such dimensions are generally indicative of an example implementation, they are not limiting. For example, if structure A is illustrated as being larger than structure B, this is generally indicative of an example implementation, but structure A is generally not required to be larger than structure B, unless otherwise indicated. Additionally, in the drawings, like reference numerals may refer to like elements throughout the discussion.

Like reference numerals refer to like elements throughout the specification. All terms including descriptive or technical terms used herein should be construed as having meanings that are obvious to one of ordinary skill in the art. When a term has an ambiguous meaning due to evolving of language, precedent cases, or the appearance of new technologies, the meaning of a term used in this disclosure should first be clarified by its usage and/or definition in this disclosure. The term should then be clarified as one of ordinary skill in the art would have understood the term at the time of this disclosure.

When a part "includes" or "comprises" an element, unless there is a particular description contrary thereto, the part can further include other elements. The term "unit" in the embodiments of the present disclosure means a software component or a hardware component that performs a specific function. A function provided by a "unit" may be divided into additional components and "units." The hardware component may include, for example, a field-programmable gate array (FPGA) or an application-specific integrated circuit (ASIC).

Reference will now be made in detail to embodiments, examples of which are illustrated in the accompanying drawings. In this regard, the present embodiments may have different forms and should not be construed as being limited to the descriptions set forth herein.

In the following description, well-known functions or constructions are not described in detail so as not to obscure the embodiments with unnecessary detail.

In the drawings, the thickness or and dimensions of various layers may be exaggerated for ease and clarity in description of the present disclosure, and the same reference numerals will be used throughout to designate the same or like elements.

According to an aspect of the present disclosure, there is provided a method of fabricating a semiconductor package, including forming a substrate, attaching a first semiconductor device to a top portion of the substrate, encapsulating the first semiconductor device using an encapsulant, forming a trench in the encapsulant, and forming a shielding layer on a surface of the encapsulant.

According to another aspect of the present disclosure, there is provided a method of fabricating a semiconductor package, including forming a first substrate on a support layer such as, for example, a wafer, attaching a semiconductor device to a top portion of the first substrate, encapsulating the semiconductor device using an encapsulant, forming a trench in the encapsulant, forming a shielding layer on a surface of the encapsulant, and forming a second substrate on the first substrate.

According to still another aspect of the present disclosure, there is provided a semiconductor package including a substrate, a semiconductor device attached to the substrate, an encapsulant encapsulating the semiconductor device on the substrate, and a shielding layer formed on a surface of the encapsulant.

As described above, in the semiconductor package according to an embodiment of the present disclosure and the fabricating method thereof, after forming semiconductor devices and an encapsulant on a substrate, a trench is formed on the encapsulant, and a shielding layer is formed on a surface of the encapsulant to shield five surfaces of the semiconductor package. Accordingly, electromagnetic waves generated from at least one of the semiconductor devices in the encapsulant can be prevented from being emitted to the outside. In addition, it is possible to prevent externally generated electromagnetic waves from penetrating into at least one of the semiconductor devices in the encapsulant.

Since adhesive tape is not used to hold the multiple semiconductor devices when forming the trench, there is no adhesive tape to cut when the trench is formed. Thus, there will not be tape burrs formed nor will there be delamination of tape to expose a gap between the substrate and a carrier.

Tape burrs may be problematic when, for example, a new adhesive tape is placed over the existing adhesive tape with tape burrs. The tape burrs may prevent the new adhesive tape from adhering properly to the existing adhesive tape. Thus, when the new adhesive tape is removed, some of the existing adhesive tape may not be removed. This is referred to as a residue phenomenon.

The delaminated tape that exposes a gap may also be problematic because when a shielding layer is formed, some of the shielding material may go into that gap. This is referred to as a backspill phenomenon.

However, with various embodiments of the disclosure, since there is no cutting of an existing adhesive tape when forming a trench, there is no adhesive tape to delaminate nor forming of tape burrs. Therefore, when the shielding layer is formed, there will not be any backspill phenomenon since there is no gap for the shielding material to penetrate into. Additionally, when, for example, an adhesive tape is applied around conductive bumps and later removed, the adhesive tape will be properly removed without leaving tape residue since there is no tape burr. Accordingly, the reliability of the semiconductor package is improved due to the lack of backspill phenomenon and residue phenomenon.

Reference will now be made in detail to various exemplary embodiments of the present disclosure.

FIGS. 1A to 1J are cross-sectional views sequentially illustrating process steps of a fabricating method of a semiconductor package according to an embodiment of the present disclosure.

The fabricating method of a semiconductor package according to an embodiment of the present disclosure includes process steps for forming a substrate 110, attaching electronic devices 121, 125 to the substrate 110, encapsulating the electronic devices 121, 125 on the substrate 110 with an encapsulant 130, forming a shielding layer 140 around the encapsulant 130, and forming conductive bumps 150 on the bottom of the substrate 110. Though the first electronic device 121 is generally illustrated and discussed as a semiconductor device (e.g., an integrated circuit, processor, memory, application specific integrated circuit, discrete logic device, programmable logic device, etc.) and the second electronic device 125 is generally illustrated and discussed as a passive device (e.g., resistor, capacitor, inductor, etc.), the scope of this disclosure is not limited by such example devices. For example, the first electronic device 121 and the second electronic device 125 may each comprise any type of device, whether active or passive.

The substrate 110 comprises a first substrate part 111 formed on a support layer 10, and a second substrate part 115 formed on the first substrate part 111. The first substrate part 111 may also be referred to as the first substrate, and the second substrate part 115 may also be referred to as the second substrate. The support layer 10 may be, for example, a wafer, a panel, carrier, support structure, etc.

As illustrated in FIG. 1A, the first substrate part 111 includes a first multi-layer conductive structure 112, and a first multi-layer dielectric structure 113 covering portions of the first multi-layer conductive structure 112. The combined first multi-layer conductive structure 112 and the first multi-layer dielectric structure 113 may also be referred to as a multi-layer signal distribution structure, a multi-layer signal redistribution structure, a multi-level redistribution layer, etc.

Figure 1B:
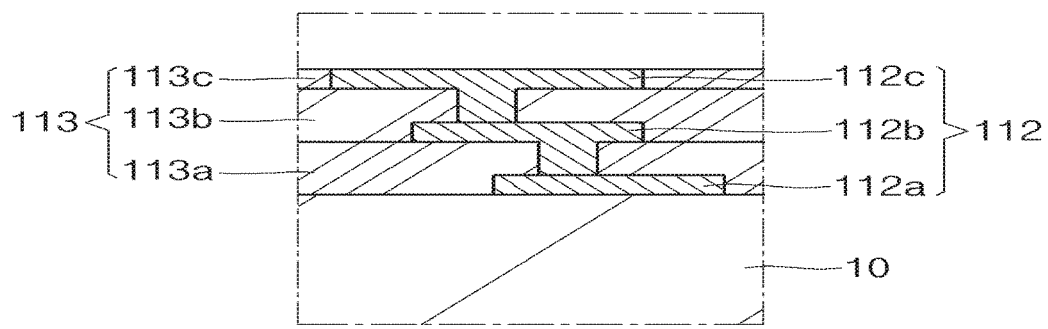

FIG. 1B, which is an enlarged view of a portion 'A' of FIG. 1A, shows that the first conductive layer 112a of the first substrate part is formed on the support layer 10. A portion of the first conductive layer 112a is covered by a first dielectric layer 113a. Then a second conductive layer 112b is formed to electrically connect to the first conductive layer 112a. A portion of the second conductive layer 112b is covered by a second dielectric layer 113b. Then a third conductive layer 112c is formed to electrically connect to the second conductive layer 112b. A portion of the third conductive layer 112c is covered by the third dielectric layer 113c. While the first multi-layer conductive structure 112 is illustrated in FIG. 1B as having three layers, the first multi-layer conductive structure 112 may have any number of layers (e.g., 1, 2, 3, 4, etc.). The support layer 10 may be made of one or more suitable materials (e.g., glass, metal, plastic, semiconductor material such as, for example, silicon (Si), etc.). However, aspects of the present disclosure are not limited thereto and the support layer 10 may be made of other suitable material(s) not named here.

The conductive layers 112a, 112b, and 112c of the first multi-layer conductive structure 112 may be made of a conductor such as, for example, copper, aluminum, gold, silver, palladium, and/or equivalents thereof by electroless plating, electroplating, and/or sputtering, but aspects of the present disclosure are not limited thereto. In addition, patterning or routing of the first multi-layer conductive structure 112 may be performed by a photolithographic process using a common photoresist, but aspects of the present disclosure are not limited thereto. Note that different conductive layers may be made of the same conductive material or of different conductive materials.

The first multi-layer dielectric structure 113 may be made of an insulating material such as, for example, an organic dielectric material (e.g., a polymer, polyimide, benzo cyclo butene, poly benz oxazole, etc.) and equivalents thereof, an inorganic dielectric material (e.g., an oxide, a nitride, etc.) and equivalents thereof, any combination thereof, etc., but aspects of the present disclosure are not limited thereto. In addition, the first multi-layer dielectric structure 113 may be formed by, for example, spin coating, spray coating, dip coating, rod coating, and equivalents thereof, but aspects of the present disclosure are not limited thereto. Note that different dielectric layers may be made of the same dielectric material or of different dielectric materials.

Figure 1C:
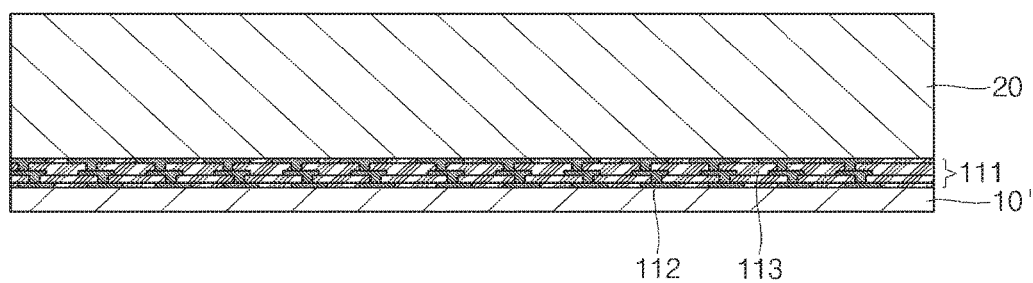

Next, a first carrier 20 may be attached to a top portion (or top side) of the first substrate part 111, and then the support layer 10 may be removed. The first carrier 20 may be made of silicon (Si), glass, metal, etc., but aspects of the present disclosure are not limited thereto. The first carrier 20 may be attached to the first substrate part 111 in any of a variety of manners (e.g., an adhesive layer, double-sided tape, etc.). Most of the support layer 10 may be removed leaving a remaining support layer 10', as illustrated in FIG. 1C. Most of the support layer 10 may be removed, for example, mechanically by back grinding a bottom surface of the support layer 10. Here, the back grinding may be performed using, for example, a diamond grinder or an equivalent thereof, but aspects of the present disclosure are not limited thereto. The support layer 10 may also be removed using other methods including, for example, laser, fluid jets, chemical means, etc., as suitable.

Figure 1D:
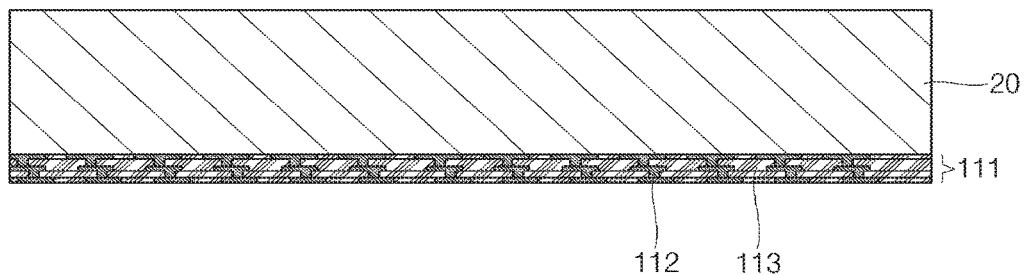

As illustrated in FIG. 1D, the remaining support layer 10' may be removed by, for example, chemical etching. The remaining support layer 10' may also be removed using other methods including, for example, laser, fluid jets, chemical means, etc., as suitable.

Figure 1E:
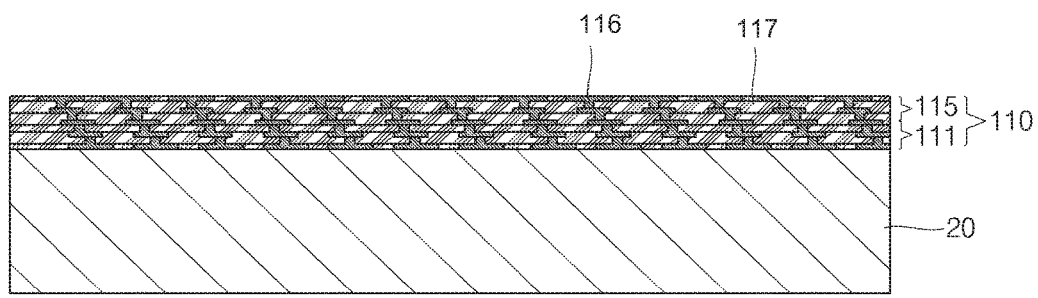

As illustrated in FIG. 1E, the second substrate part 115 is formed on the first substrate part 111, for example on the side of the first substrate part 111 that was previously covered by the support layer 10. For this process, the first carrier 20 and the first substrate part 111 are turned upside down so that the first substrate part 111 is on top. The second substrate part 115 is then formed on the first substrate part 111. The second substrate part 115, and/or the forming thereof, may share any or all characteristics with the first substrate part 111, and/or the forming thereof. For example, the second substrate part 115 may comprise a second multi-layer conductive structure 116, which may share any or all characteristics with the first multi-layer conductive structure 112, and a second multi-layer dielectric structure 117 covering the second multi-layer conductive structure 116, which may share any or all characteristics with the first multi-layer dielectric structure 113. The substrate 110 may be completed in such a manner.

As described above, the substrate 110 may be completed by receiving the support layer 10 from a wafer fabrication process and forming the first substrate part 111 on the surface of the support layer 10 during a packaging process. Similarly, the second substrate part 115 may also be formed on the first substrate part 111 during a packaging process. Accordingly, small line width (for example, less than 100 μm) and fine pitch interconnection (for example, less than 100 μm) may be achieved on the substrate 110, thereby providing high-density interconnect technology. The substrate 110 configured in such a manner may be formed by a SWIFT (Silicon Wafer Integrated Fan-out Technology) process. Alternatively, the substrate 110 may also be completed by forming the first substrate part 111 on the support layer 10 during the wafer fabrication process and forming the second substrate part 115 during the packaging process. The substrate 110 configured in such a manner may be formed by a SLIM (Silicon-Less Integrated Module) process. Accordingly, small line width (for example, less than 100 μm) and fine pitch interconnection (for example, less than 100 μm) may be achieved on the substrate 110, thereby providing high-density interconnect technology.

Figure 1F:
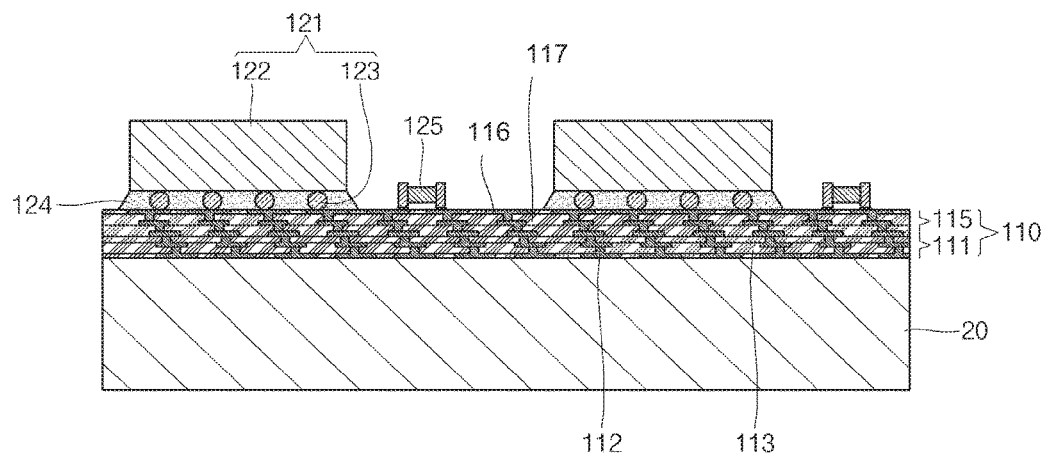

FIG. 1F illustrates attaching electronic devices 121 and 125 to a top portion (or side) of the substrate 110. The first and second electronic devices 121 and 125 may be electrically connected to the second multi-layer conductive structure 116 of the second substrate part 115. In an example method, the first and second electronic devices 121 and 125 may be electrically connected to the second multi-layer conductive structure 116 by a mass reflow method, a thermal compression bonding method, a laser bonding method, or other suitable methods.

As an example, the first electronic device 121 (e.g., a semiconductor device) may comprise a semiconductor die 122 and a plurality of conductive bumps 123, and the second electronic device 125 may be a passive device or an active device. Here, the semiconductor die 122 may include an electric circuit such as, for example, a digital signal processor (DSP), a microprocessor, a network processor, a power management processor, an audio processor, an RF circuit, a wireless baseband system-on-chip (SoC) processor, a sensor, or an application specific integrated circuit (ASIC). The semiconductor die 122 may also comprise, for example, memory, which may include volatile and/or non-volatile memory.

The first electronic device 121 may be stably attached to the second substrate part 115 by electrically connecting the plurality of conductive bumps 123 to the second multi-layer conductive structure 116 and then injecting an underfill 124 into a region between the semiconductor die 122 and the second substrate part 115. The underfill 124 may improve a mechanical binding strength between the first electronic device 121 and the second substrate part 115 while protecting the plurality of conductive bumps 123. For example, the plurality of conductive bumps 123 may include, but is not limited to, solder bumps, conductive pillars (e.g., copper pillars), conductive posts (e.g., copper posts), conductive pillars having solders, conductive posts having solders, and equivalents thereof, but aspects of the present disclosure are not limited thereto. In addition, the underfill 124 may be made of, for example, epoxy, a thermosetting material, a thermocurable material, polyimide, polyurethane, a polymeric material, filled epoxy, a filled thermosetting material, a filled thermocurable material, filled polyimide, filled polyurethane, a filled polymeric material, fluxed underfill, and equivalents thereof, but aspects of the present disclosure are not limited thereto. The second electronic device 125 may be similarly attached and/or underfilled. Note that such underfill may also be performed by a molded underfill during the encapsulation step discussed herein.

Figure 1G:
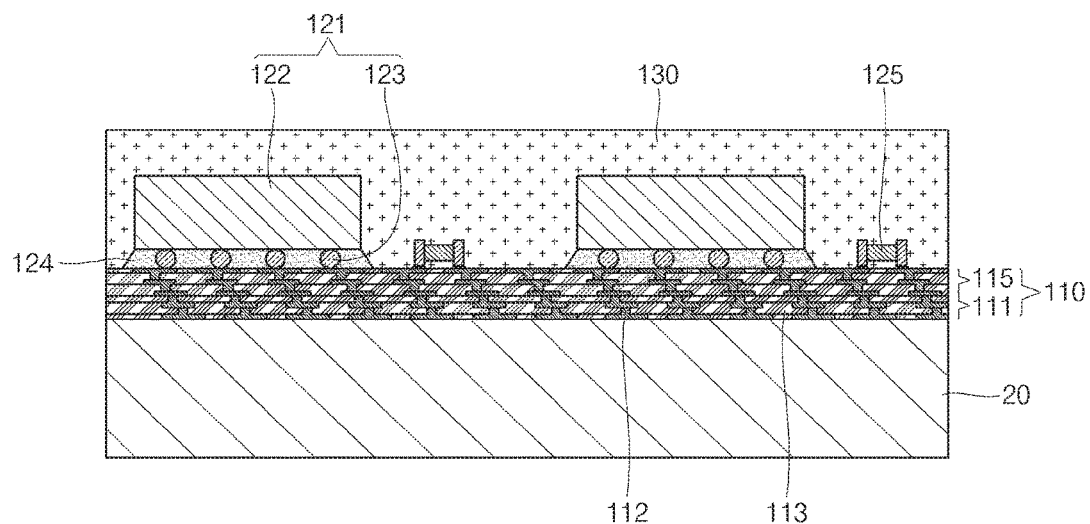

As illustrated in FIG. 1G, the top portion (or side) of the substrate 110 is encapsulated (or covered) by an encapsulant 130. More specifically, the electronic devices 121 and 125 mounted on the substrate 110 are encapsulated by the encapsulant 130. The encapsulant 130 may encapsulate the electronic devices 121 and 125, thereby alleviating damage to the electronic devices 121 and 125 by external impacts or environmental conditions. Various embodiments may encapsulate completely, while others may encapsulate partially. Accordingly, unless otherwise specified, "encapsulation" can be complete encapsulation or partial encapsulation. The encapsulant 130 may be, for example, an epoxy molding compound for general transfer molding, a glop top (or glob top) curable at room temperature for dispensing, spin-coated encapsulant, and equivalents thereof, but aspects of the present disclosure are not limited thereto.

Figure 1H:
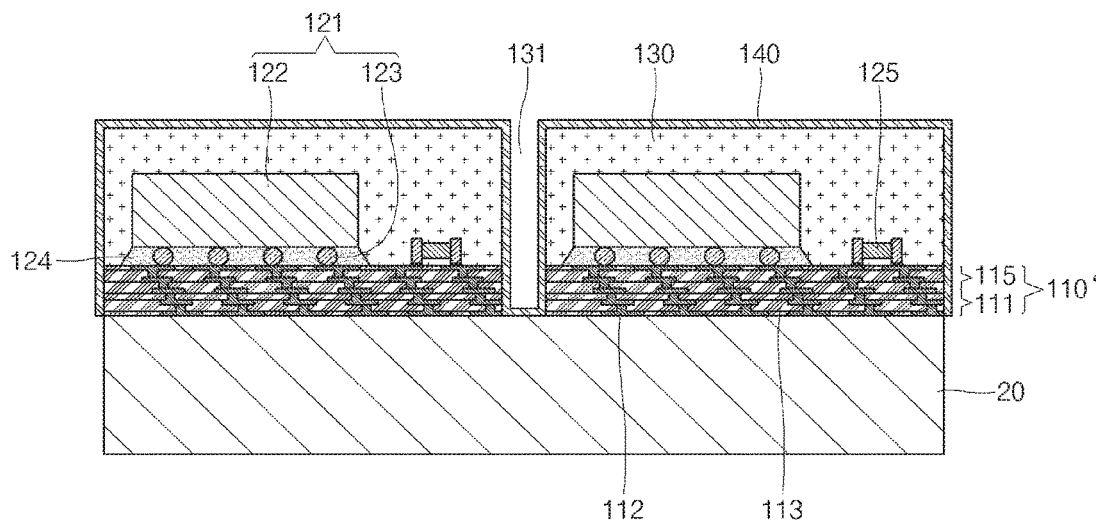

To form a shielding layer 140 (or conductive layer), a trench 131 is formed in the encapsulant 130, and a shielding layer 140 is formed on a surface of the encapsulant 130, including on the inner walls of the trench 131 (e.g., side walls, bottom surface, etc.). As illustrated in FIG. 1H, the trench 131 is formed in the encapsulant 130. The trench 131 is formed to pass through the encapsulant 130 and the substrate 110 until the first carrier 20 is reached. Therefore, the substrate 110 can be said to have been cut into several local substrates 110'. Accordingly, each set of the electronic devices 121 and 125 on the local substrate 110' is substantially separated into an individual semiconductor package. However, since the first carrier 20 is positioned under the encapsulant 130, the local substrates 110' are held on the first carrier 20.

Next, the shielding layer 140 is formed on an upper surface and side surfaces of the encapsulant 130, the walls of the trench 131 (e.g., including side walls, a bottom surface, etc.), and the side surfaces of the local substrates 110'. The walls of the trench 131 may also be considered as side surfaces of the encapsulant 130. The side surfaces of the local substrates 110' and/or the walls of the trench 131 may be substantially vertical. However, the side surfaces and/or the walls may have other shapes and/or orientations such as, for example, slanted, stepped, curved, etc.

The shielding layer 140 may be electrically connected to a portion of the substrate 110 that is connected to ground, for example, via a first multi-layer conductive structure 112 that is connected to ground. Therefore, the shielding layer 140 may shield the encapsulant 130 to prevent electromagnetic waves generated from at least one of the electronic devices 121 and 125 in the encapsulant 130 from being emitted to the outside. In addition, the shielding layer 140 may also shield the electronic devices 121 and 125 in the encapsulant 130 from being exposed to externally generated electromagnetic waves.

The shielding layer 140 may be formed, for example, by spray coating, sputtering, dip-coating, spin-coating, etc., a coating of a conductive paste (or liquid or other type of material) mixed with conductive metal powder on the surface of the encapsulant 130, but aspects of the present disclosure are not limited thereto. The shielding layer 140 may be formed of any of a variety of conductive materials (e.g., metals, conductive liquids or pastes, etc.). Note that one or more other layers (e.g., one or more conductive layers and/or one or more dielectric layers) may be formed on the shielding layer 140.

As shown in FIG. 1H, the shielding layer 140 may also be at the bottom of the trench 131. In that case, the portion of the shielding layer 140 at the bottom of the trench 131 may need to be removed to allow separation of the adjacent packages that are separated by the trench 131. The removal may happen at any time up to the point when the adjacent packages need to be separated, and may use any suitable method including those already described for removing material. Such removal may, for example, be performed by mechanical cutting or grinding, chemical etching, laser ablation, etc.

Some embodiments might not form the shielding layer 140 at the bottom of the trench 131, and hence there is no need to remove that portion of the shielding layer 140. Other embodiments may have the trench 131 extend into the first carrier 20 rather than stop at the first carrier 20 as shown in FIG. 1H. Accordingly, even if the bottom of the trench 131 has a shielding layer, when the first carrier 20 is removed, the portion of the shielding layer at the bottom of the trench 131 will also be removed.

In forming the conductive bumps 150, the first carrier 20 is removed, and conductive bumps 150 are formed on the local substrate 110'.

Figure 1I:
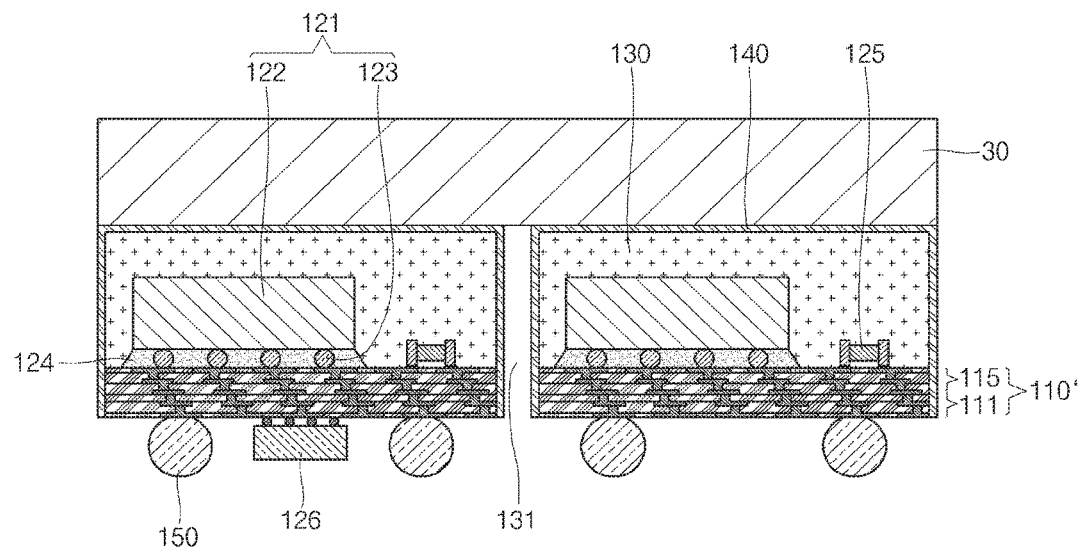

First, as illustrated in FIG. 1I, a second carrier 30 is attached to the shielding layer 140 on a top portion of the encapsulant 130. The first carrier 20 positioned under the substrate 110 is then removed using one or more suitable methods described herein (e.g., grinding and/or etching, applying adhesive release temperatures or other energy, peeling, sheering, etc.). Accordingly, the first substrate part 111 is exposed to the outside. The conductive bumps 150 are formed on the first multi-layer conductive structure 112 of the first substrate part 111 to electrically connect to the first multi-layer conductive structure 112.

Subsequent handling process(es) may handle a plurality of the sets of electronic devices 121 and 125 on their local substrates 110' since the second carrier 30 is attached to the shielding layer 140 of the local substrates 110' separated by the trench 131.

In some embodiments, a third semiconductor device 126 may be attached to the first substrate part 111 before, during, and/or after forming the conductive bumps 150. Here, for example, the third semiconductor device 126 is formed to have a smaller height than the conductive bumps 150. Therefore, according to the present disclosure, the top and bottom surfaces of the local substrate 110' may have electronic devices attached thereto.

The conductive bumps 150 may be provided in forms of, for example, ball grid arrays, land grid arrays, pin grid arrays, or other suitable conductive interconnects. In addition, the conductive bumps 150 may be formed from, for example, eutectic solder (Sn37Pb), high lead solder (Sn95Pb), lead-free solder (SnAg, SnAu, SnCu, SnZn, SnZnBi, SnAgCu, SnAgBi, etc.) and equivalents thereof, but aspects of the present disclosure are not limited thereto. For example, the conductive bumps 150 may be, but is not limited to, copper pillars or copper posts, copper core solder balls, etc.

Figure 1J:
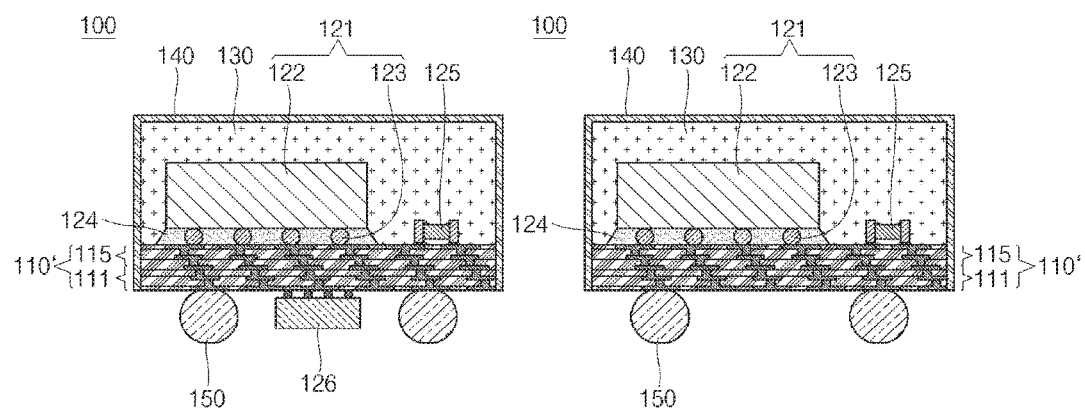

As illustrated in FIG. 1J, after forming conductive bumps 150, the second carrier 30 is removed, thereby completing the individual semiconductor packages 100. The second carrier 30 may be removed in any of a variety of manners (e.g., grinding and/or etching, applying adhesive release temperatures or other energy, peeling, sheering, etc.).

The semiconductor package 100 formed by the aforementioned fabricating method includes the local substrate 110', the electronic devices 121 and 125 attached to the top portion of the local substrate 110', the encapsulant 130 encapsulating the electronic devices 121 and 125 on the local substrate 110', the shielding layer 140 formed on the surface of the encapsulant 130 and on lateral side surfaces of the local substrate 110', and the conductive bumps 150 attached to bottom portion of the local substrate 110'.

As described above, the fabricating method of the semiconductor package according to the embodiment of the present disclosure includes forming the substrate 110, the electronic devices 121 and 125, and the encapsulant 130 on the support layer 10. Then, the trench 131 is formed in the encapsulant 130 (and in the substrate 110 in various embodiments), and the shielding layer 140 is formed on the surface of the encapsulant 130 to shield five surfaces (the four side surfaces and the top surface) of the semiconductor package 100. Therefore, according to the present disclosure, the shielding layer 140 shields the encapsulant 130 to prevent electromagnetic waves generated from at least one of the electronic devices 121 and 125 in the encapsulant 130 from being emitted to the outside. In addition, the shielding layer 140 may also shield the electronic devices 121 and 125 in the encapsulant 130 from externally generated electromagnetic waves. Accordingly, the reliability of the semiconductor package 100 can be improved.

In addition, according to the present disclosure, after forming the trench 131 passing through the encapsulant 130 and the substrate 110, the shielding layer 140 is formed on the encapsulant 130. However, there is no backspill phenomenon where the material that forms the shielding layer 140 penetrates into a region between the substrate 110 and the first carrier 20 since there is no adhesive tape that may have delaminated when cut as part of forming the trench 131. This may also improve the reliability of the semiconductor package 100.

Furthermore, according to the present disclosure, the shielding layer 140 may be formed, then the conductive bumps 150 may be formed, and then a new adhesive tape may be applied around the conductive bumps 150. Since the new adhesive tape is not placed over a previously placed adhesive tape, there is no worry of tape burrs that may have formed due to cutting the previously placed adhesive tape when forming the trench 131. Accordingly, removing the new adhesive tape from around the conductive bumps 150 will not result in the residue phenomenon. This lack of residue phenomenon may also improve reliability of the semiconductor package 100.

FIGS. 2A to 2H are cross-sectional views sequentially illustrating process steps of a fabricating method of a semiconductor package according to another embodiment of the present disclosure. The example method (or process) or method steps thereof shown in FIGS. 2A to 2H may share any or all characteristics with the example method (or process) or method steps thereof shown in FIGS. 1A-1J and discussed herein. For example, generally analogous steps of the various example methods discussed herein may share materials and/or methods.

The fabricating method of a semiconductor package according to another embodiment of the present disclosure includes forming a first substrate part 111 on the support layer 10, attaching electronic devices 121, 125 to the first substrate part 111, encapsulating the electronic devices 121, 125 on the first substrate part 111 with an encapsulant 130, forming a shielding layer 140 on the encapsulant 130, forming a second substrate part 115 on the first substrate part 111, and forming conductive bumps 150 on the second substrate part 115.

The fabricating method illustrated in FIGS. 2A to 2H is substantially the same as that illustrated in FIGS. 1A to 1J, and the following description will focus on differences therebetween.

Figure 2A:
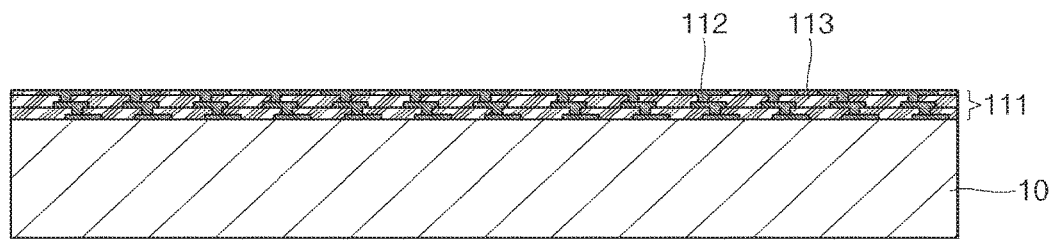
FIGS. 2A to 2H are cross-sectional views sequentially illustrating process steps of a fabricating method of a semiconductor package according to another embodiment of the present disclosure.

As illustrated in FIG. 2A, the first substrate part 111 is formed on the support layer 10. The first substrate part 111 includes a first multi-layer conductive structure 112 and a first multi-layer dielectric structure 113 covering the first multi-layer conductive structure 112 formed on the support layer 10. The first substrate part 111 illustrated in FIG. 2A may, for example, be the same as that illustrated in FIG. 1B. For example, the first substrate part 111 may be completed by forming a first conductive layer 112a on the support layer 10 and covering a portion of the first conductive layer 112a with a first dielectric layer 113a. Then, a second conductive layer 112b may be formed to electrically connect to the first conductive layer 112a, and a portion of the second conductive layer 112b may be covered by a second dielectric layer 113b. In addition, a third conductive layer 112c may be formed to electrically connect to the second conductive layer 112b, and a portion of the third conductive layer 112c may be covered by the third dielectric layer 113c. While the first multi-layer conductive structure 112 is illustrated in FIG. 2A as having three levels, the first multi-layer conductive structure 112 may have any number of layers (e.g., 1, 2, 3, 4, etc.). The support layer 10 may be made of silicon (Si), glass and/or a metal, but aspects of the present disclosure are not limited thereto.

Figure 2B:
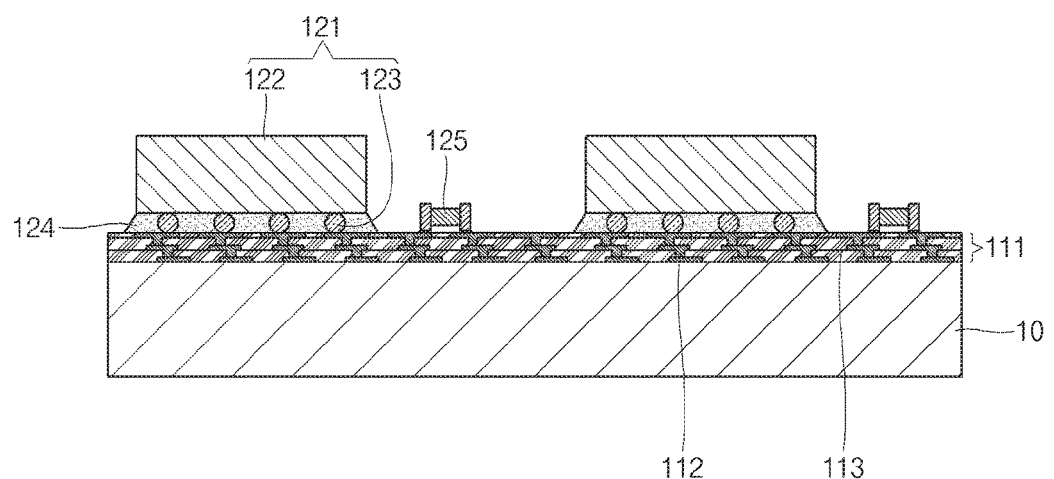

As illustrated in FIG. 2B, the electronic devices 121 and 125 are attached to a top portion of the first substrate part 111, and are electrically connected to the first multi-layer conductive structure 112 of the first substrate part 111. As an example, the first and second electronic devices 121 and 125 may be electrically connected to the first multi-layer conductive structure 112 by a mass reflow method, a thermal compression bonding method, a laser bonding method, or any other suitable method.

As an example, the first electronic device 121 (e.g., a semiconductor device) may comprise a semiconductor die 122 and a plurality of conductive bumps 123, and the second electronic device 125 may be a passive device or an active device. Here, the semiconductor die 122 may include an electric circuit such as, for example, a digital signal processor (DSP), a microprocessor, a network processor, a power management processor, an audio processor, an RF circuit, a wireless baseband system-on-chip (SoC) processor, a sensor, or an application specific integrated circuit (ASIC). The semiconductor die 122 may also comprise, for example, memory, which may include volatile and/or non-volatile memory.

The first electronic device 121 may be stably attached to the first substrate part 111 by electrically connecting the plurality of conductive bumps 123 to the first multi-layer conductive structure 112 and then injecting an underfill 124 into a region between the semiconductor die 122 and the first substrate part 111. The underfill 124 may improve a mechanical binding strength between the first electronic device 121 and the first substrate part 111 while protecting the plurality of conductive bumps 123. For example, the plurality of conductive bumps 123 may include, but is not limited to, solder bumps, conductive pillars (e.g., copper pillars), conductive posts (e.g., copper posts), conductive pillars having solders, conductive posts having solders, and equivalents thereof, but aspects of the present disclosure are not limited thereto. In addition, the underfill 124 may be made of, for example, epoxy, a thermosetting material, a thermocurable material, polyimide, polyurethane, a polymeric material, filled epoxy, a filled thermosetting material, a filled thermocurable material, filled polyimide, filled polyurethane, a filled polymeric material, fluxed underfill, and equivalents thereof, but aspects of the present disclosure are not limited thereto. The second electronic device 125 may be similarly attached and/or underfilled. Note that such underfill may also be performed by a molded underfill during the encapsulation step discussed herein.

Figure 2C:
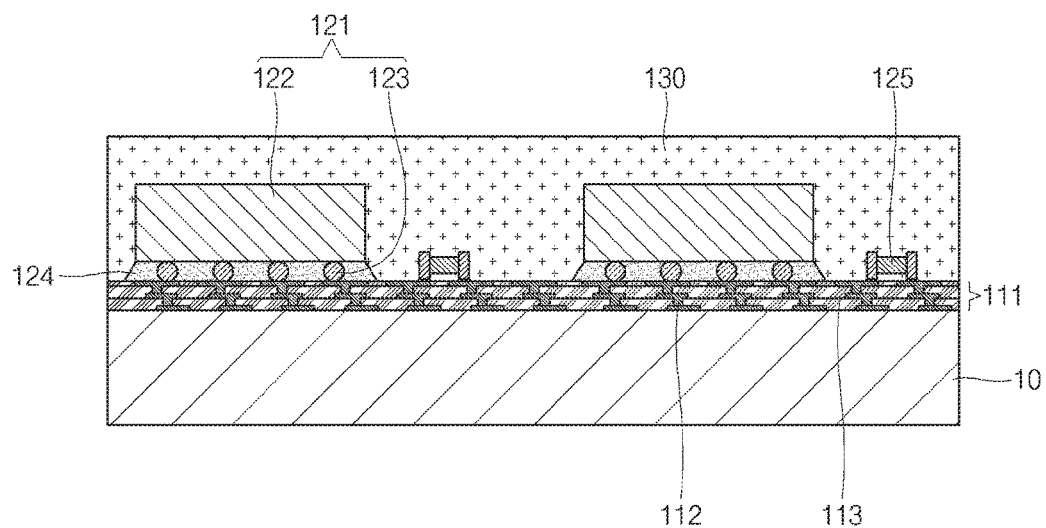

As illustrated in FIG. 2C, the top portion (or side) of the first substrate part 111 is encapsulated (or covered) by the encapsulant 130. More specifically, the electronic devices 121 and 125 mounted on the first substrate part 111 are encapsulated by the encapsulant 130. The encapsulant 130 encapsulates the electronic devices 121 and 125, thereby alleviating damage to the electronic devices 121 and 125 by external impacts or environmental conditions. As discussed herein with regard to FIG. 1G, various embodiments may encapsulate completely, while others may encapsulate partially. Accordingly, unless otherwise specified, "encapsulation" can be complete encapsulation or partial encapsulation. The encapsulant 130 may be, for example, an epoxy molding compound for general transfer molding, a glop top (or glob top) curable at room temperature for dispensing, spin-coated encapsulant, and equivalents thereof, but aspects of the present disclosure are not limited thereto.

Figure 2D:
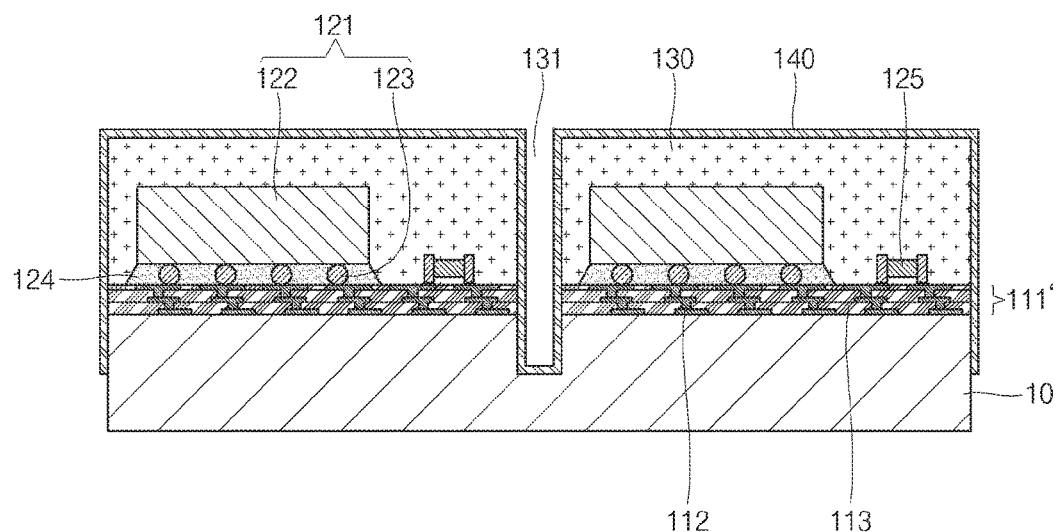

To form a shielding layer 140 (or conductive layer), a trench 131 is formed in the encapsulant 130, and a shielding layer 140 is formed on a surface of the encapsulant 130, including on the inner walls of the trench 131 (e.g., side walls, bottom surface, etc.). As illustrated in FIG. 2D, the trench 131 is formed in the encapsulant 130. The trench 131 is formed to pass through the encapsulant 130 and the first substrate part 111, and further into the support layer 10. Therefore, the first substrate part 111 can be said to have been cut into several local first substrate parts 111'. Accordingly, each set of the electronic devices 121 and 125 on the local first substrate part 111' is substantially separated into an individual semiconductor package. However, since the support layer 10 is positioned under the encapsulant 130, the local substrate parts 111' are held on the support layer 10.

Next, the shielding layer 140 is formed on an upper surface and side surfaces of the encapsulant 130, the walls of the trench 131 (e.g., including side walls, a bottom surface, etc.), and the side surfaces of the local first substrate part 111'. The walls of the trench 131 may also be considered as side surfaces of the encapsulant 130. The side surfaces of the local first substrate part 111' and/or the walls of the trench 131 may be substantially vertical. However, the side surfaces and/or the walls may have other shapes and/or orientation such as, for example, slanted, stepped, curved, etc.

The shielding layer 140 may be electrically connected to a portion of the local first substrate part 111' that is connected to ground, for example, via a conductive trace of the first multi-layer conductive structure 112 that is connected to ground. Therefore, the shielding layer 140 may shield the encapsulant 130 to prevent electromagnetic waves generated from at least one of the electronic devices 121 and 125 in the encapsulant 130 from being emitted to the outside. In addition, the shielding layer 140 may also shield the electronic devices 121 and 125 in the encapsulant 130 from being exposed to externally generated electromagnetic waves.

The shielding layer 140 may be formed, for example, by spray coating, sputtering, dip-coating, spin-coating, etc., a coating of a conductive paste (or liquid or other type of material) mixed with conductive metal powder on the surface of the encapsulant 130, but aspects of the present disclosure are not limited thereto.

In forming the second substrate part 115, the support layer 10 is removed, and the second substrate part 115 is formed on the first substrate part 111. The shielding layer 140 may be formed of any of a variety of conductive materials (e.g., metals, conductive liquids or pastes, etc.). Note that one or more other layers (e.g., one or more conductive layers and/or one or more dielectric layers) may be formed on the shielding layer 140.

Figure 2E:
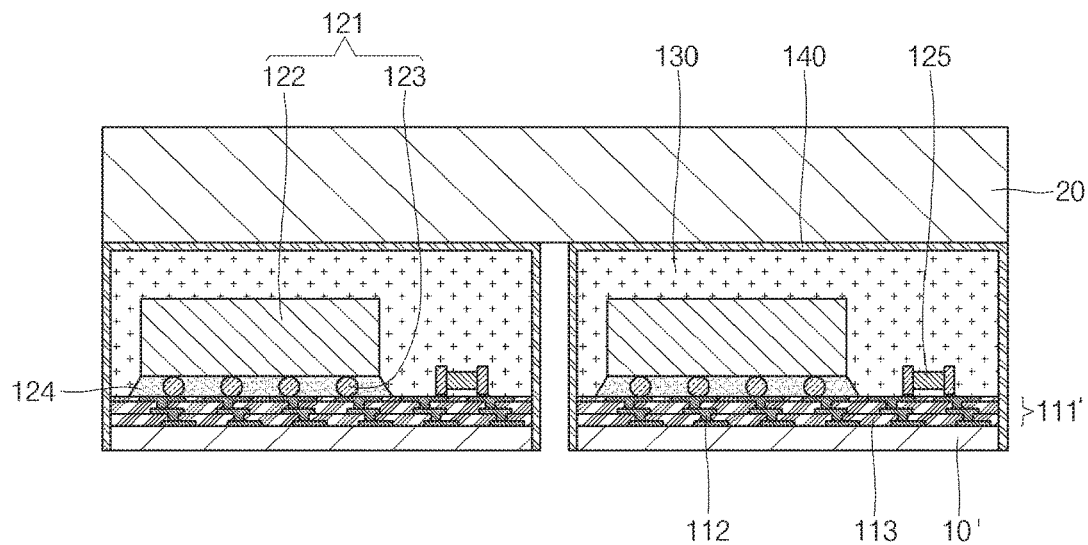
Figure 2F:
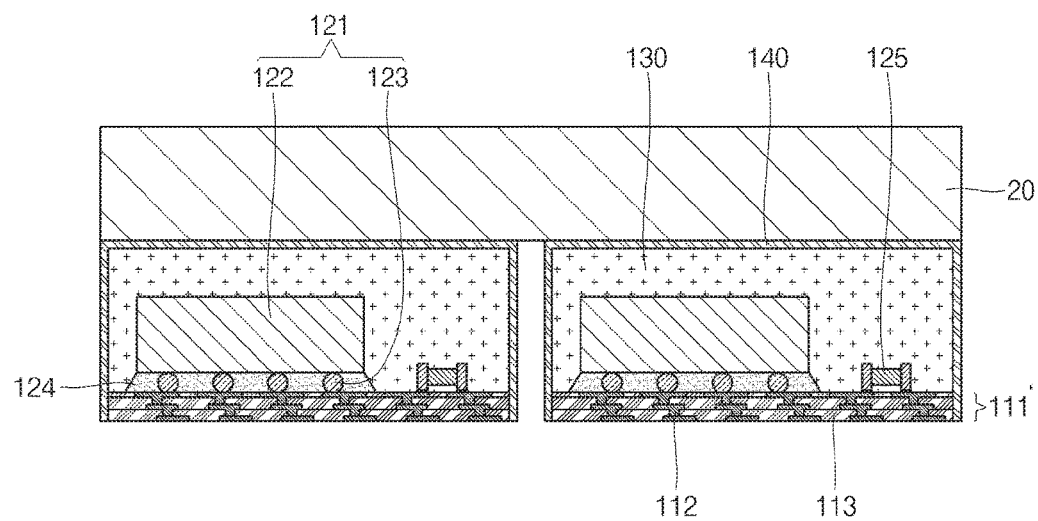

First, for example, the first carrier 20 is attached to the shielding layer 140 formed on the top portion (or side) of the encapsulant 130, and the support layer 10 is then removed. The first carrier 20 may be attached to the shielding layer 140 (or an intervening layer) in any of a variety of manners (e.g., an adhesive layer, double-sided tape, etc.). As discussed herein with regard to FIGS. 1C-1D, the support layer 10 may be removed in multiple steps or may also be removed in a single step. For example, as illustrated in FIG. 2E, a portion of the support layer 10 is mechanically removed by back grinding a bottom surface of the support layer 10, leaving a remaining support layer 10'. Here, the back grinding may be performed using, for example, a diamond grinder or an equivalent thereof, but aspects of the present disclosure are not limited thereto. Any of various other methods described earlier may also be utilized. Next, as illustrated in FIG. 2F, the remaining support layer 10' is removed by chemical etching, thereby removing the support layer 10. As discussed herein, the remaining support layer 10' may also be removed by other suitable methods. The substrate 110 may be made of silicon (Si) or glass or metal, but aspects of the present disclosure are not limited thereto.

Figure 2G:
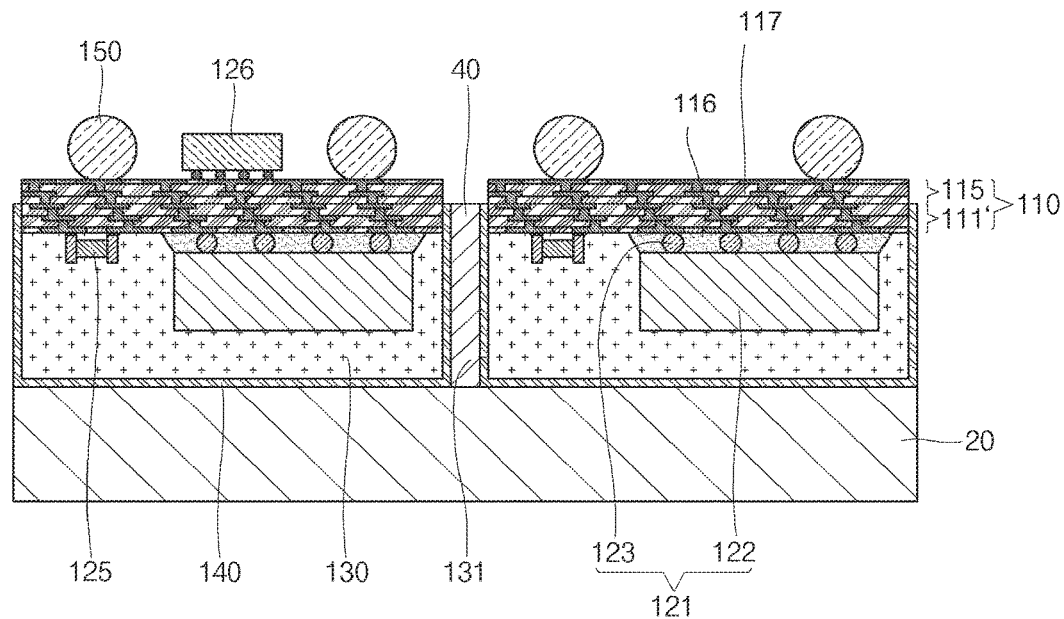

Next, the second substrate part 115 is formed on the local first substrate parts 111'. Such forming may, for example, share any or all characteristics with the forming of the second substrate part 115 discussed with regard to FIG. 1E. In detail, as illustrated in FIG. 2G, the local first substrate part 111' is turned over to face upward, and the trench 131 is filled by injecting a photoresist 40 (or dielectric material or other suitable material) into the trench 131. The photoresist 40 may, for example, be injected into the trench 131 to facilitate a subsequent handling process. Then, the second substrate part 115 is formed on the local first substrate parts 111' to complete the substrate 110. Here, the second substrate part 115 includes a second multi-layer conductive structure 116 and a second multi-layer dielectric structure 117 covering the second multi-layer conductive structure 116, for example in a manner similar to (or the same as) the first multi-layer conductive structure 112 and the first multi-layer dielectric structure 113 of the first substrate part 111. Note that the second substrate part 115 may be formed in a manner that forms an entire continuous second substrate part 115 over the local first substrate parts 111', including over the photoresist 40 and the shielding layer 140 in the trench 131, and the portions formed over the photoresist 40 and the shielding layer 140 may then be removed to result in respective local second substrate parts over respective local first substrate parts 111'. Alternatively, the second substrate part 115 may be originally formed only over the first substrate parts 111' and not over the photoresist 40 and the shielding layer 140 of the trench 131.

The conductive bumps 150 are then formed on the substrate 110. As illustrated in FIG. 2G, the conductive bumps 150 are formed on the second multi-layer conductive structure 116 of the second substrate part 115 to electrically connect to the second multi-layer conductive structure 116. The conductive bumps 150 may be provided in forms of, for example, ball grid arrays, land grid arrays, pin grid arrays, or other suitable conductive interconnects. In addition, the conductive bumps 150 may be formed from, for example, eutectic solder (Sn37Pb), high lead solder (Sn95Pb), lead-free solder (SnAg, SnAu, SnCu, SnZn, SnZnBi, SnAgCu, SnAgBi, etc.) and equivalents thereof, but aspects of the present disclosure are not limited thereto. For example, the conductive bumps 150 may be, but is not limited to, copper pillars or copper posts, copper core solder balls, etc.

In some embodiments, a third semiconductor device 126 may be attached to the second substrate part 115 before, during, and/or after forming the conductive bumps 150. Here, for example, the third semiconductor device 126 is formed to have a smaller height than the conductive bumps 150. Therefore, according to the present disclosure, the top and bottom surfaces of the substrate 110 may have electronic devices attached thereto.

Figure 2H:
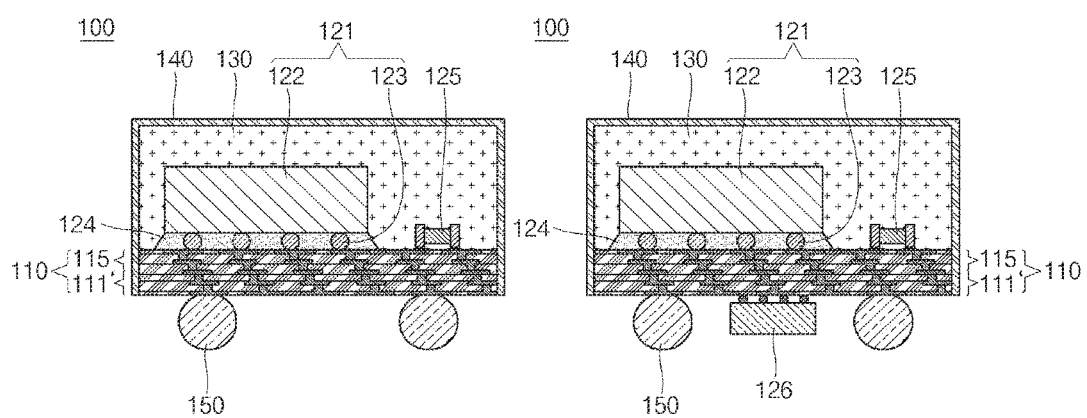

Next, as illustrated in FIG. 2H, in forming the conductive bumps, the first carrier and the photoresist 40 are removed, thereby completing the individual semiconductor packages 100. The first carrier 20 may be removed in any of a variety of manners (e.g., grinding and/or etching, applying adhesive release temperatures or other energy, peeling, sheering, etc.).

The semiconductor package 100 formed by the aforementioned fabricating method includes the substrate 110, the electronic devices 121 and 125 attached to the top portion of the substrate 110, the encapsulant 130 encapsulating the electronic devices 121 and 125 on the substrate 110, the shielding layer 140 formed on the surface of the encapsulant 130 and on lateral side surfaces of the local substrate 110', and the conductive bumps 150 attached to bottom portion of the substrate 110. For example, as with the example method shown in FIGS. 1A-1J and discussed herein, the example method shown in FIGS. 2A-2H may be utilized to produce the semiconductor package 100.

FIGS. 3A to 3G are cross-sectional views sequentially illustrating process steps of a fabricating method of a semiconductor package according to still another embodiment of the present disclosure. The example method (or process) or method steps thereof shown in FIGS. 3A to 3G may share any or all characteristics with the example methods or method steps thereof shown in FIGS. 2A to 2H and/or shown in FIGS. 1A-1J and discussed herein. For example, generally analogous steps of the various example methods discussed herein may share materials and/or methods.

The fabricating method of a semiconductor package according to still another embodiment of the present disclosure includes forming a substrate 210, attaching electronic devices 121, 125 to the substrate 210, encapsulating the electronic devices 121, 125 on the substrate 210 with an encapsulant 230, forming conductive bumps 150 on the substrate 210, and forming a shielding layer 240 on the encapsulant 230.

Figure 3A:
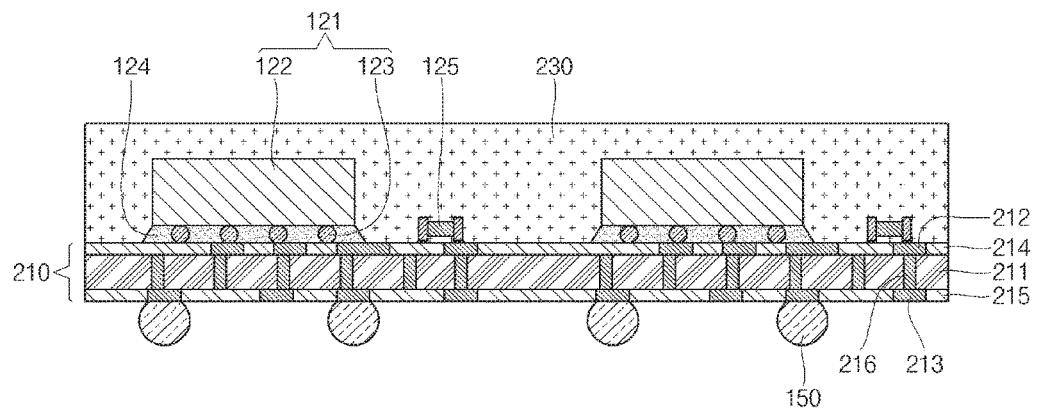
FIGS. 3A to 3G are cross-sectional views sequentially illustrating process steps of a fabricating method of a semiconductor package according to still another embodiment of the present disclosure.

In forming a substrate, as illustrated in FIG. 3A, a substrate 210 is prepared, the substrate 210 including a planar insulation layer (a core layer) 211, a first circuit pattern 212 formed on a top surface of the insulation layer 211, a second circuit pattern 213 formed on a bottom surface of the insulation layer 211, conductive vias 216 electrically connecting the first circuit pattern 212 and the second circuit pattern 213, and first and second dielectric (or passivation) layers 214 and 215 protecting the first and second circuit patterns 212 and 213, respectively. The first dielectric layer 214 and the second dielectric layer 215 may, as shown, cover lateral sides of the first circuit pattern 212 and the second circuit pattern 213, respectively. The first dielectric layer 214 and the second dielectric layer 215 may also, for example, cover portions of top sides of the first circuit pattern 212 and the second circuit pattern 213, respectively (e.g., comprising apertures through which bond pads are exposed), That is to say, the substrate 210 may be formed as a printed circuit board (PCB) having a core. While the substrate 210 with a single layer is illustrated in FIG. 3A, it may also be formed as a multi-layered PCB. Note that the substrate 210 may share any or all characteristics with the substrate 110 (or parts thereof) discussed herein.

As illustrated in FIG. 3A, a first electronic device 121 and a second electronic device 125 are attached to top portion of the substrate 210. The first and second electronic devices 121 and 125 are attached to the first circuit pattern 212 of the substrate 210. In an example, the first and second electronic devices 121 and 125 may be electrically connected to the first circuit pattern 212 by a mass reflow method, a thermal compression bonding method, a laser bonding method, or any other suitable method.

As an example, the first electronic device 121 (e.g., a semiconductor device) may comprise a semiconductor die 122 and a plurality of conductive bumps 123, and the second electronic device 125 may be a passive device or an active device. Here, the semiconductor die 122 may include an electric circuit such as, for example, a digital signal processor (DSP), a microprocessor, a network processor, a power management processor, an audio processor, an RF circuit, an RF circuit, a wireless baseband system-on-chip (SoC) processor, a sensor, or an application specific integrated circuit (ASIC). The semiconductor die 122 may also comprise, for example, memory, which may include volatile and/or non-volatile memory.

As illustrated in FIG. 3A, the electronic devices 121 and 125 mounted on the substrate 210 are encapsulated using an encapsulant 230. The encapsulant 230 encapsulates the electronic devices 121 and 125, thereby alleviating damage to the electronic devices 121 and 125 by external impacts or environmental conditions. The encapsulant 230 may be, for example, an epoxy molding compound for general transfer molding, a glop top curable at room temperature for dispensing, and equivalents thereof, but aspects of the present disclosure are not limited thereto. The encapsulant 230 and/or the forming thereof may share any or all characteristics with the encapsulant 130 and/or the forming thereof discussed herein.

As illustrated in FIG. 3A, the conductive bumps 150 may be formed on the second circuit pattern 213 to be electrically connected to the second circuit pattern 213. For example, the conductive bumps 150 may be provided in forms of, for example, ball grid arrays, land grid arrays, pin grid arrays, etc. In addition, the conductive bumps 150 may be formed from, for example, eutectic solder (Sn37Pb), high lead solder (Sn95Pb), lead-free solder (SnAg, SnAu, SnCu, SnZn, SnZnBi, SnAgCu, SnAgBi, etc.) and equivalents thereof, but aspects of the present disclosure are not limited thereto. For example, the conductive bumps 150 may be, but is not limited to, copper pillars or copper posts, copper core solder balls, etc.

Figure 3B:
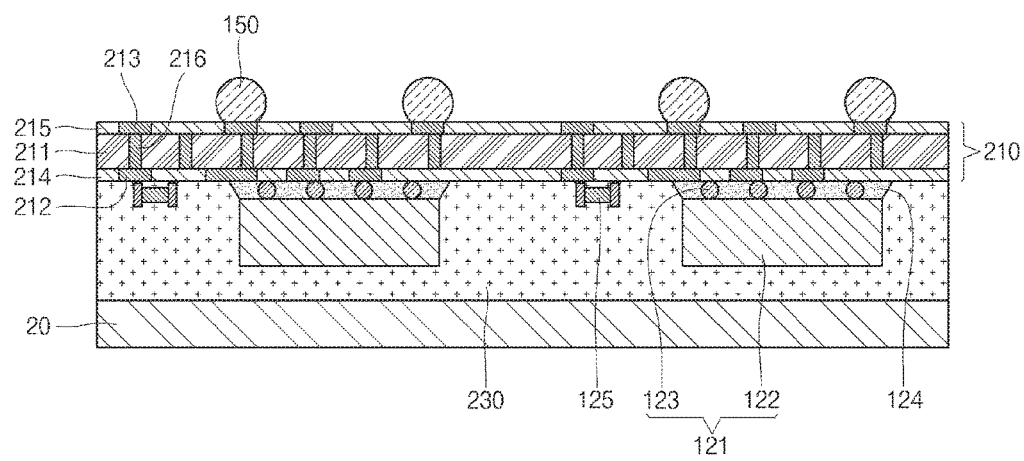

As illustrated in FIG. 3B, a first carrier 20 may be attached to a top portion (or side) of the encapsulant 230, and the substrate 210 may be turned over to allow the conductive bumps 150 to be positioned upward. The first carrier 20 may be attached to the encapsulant 230 (or an intervening layer) in any of a variety of manners (e.g., an adhesive layer, double-sided tape, etc.). The substrate 210 may, for example, be positioned to allow the conductive bumps 150 to be positioned upward, with the first carrier 20 attached to the encapsulant 230.

Figure 3C:
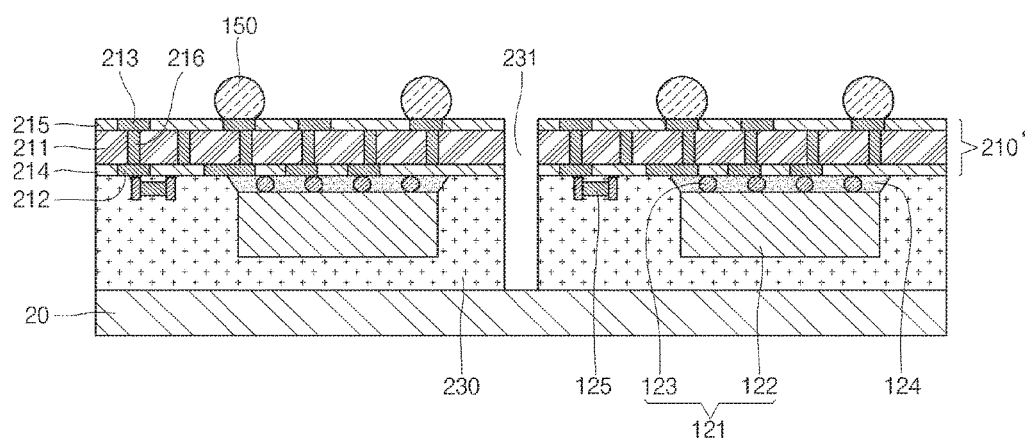

Next, as illustrated in FIG. 3C, the trench 231 is formed in the encapsulant 230. The trench 231 is formed to pass through the substrate 210 and the encapsulant 230 until the first carrier 20 is reached. Note that the trench 231 and/or the forming thereof may share any or all characteristics with the trench 131 and/or the forming thereof, discussed herein. In addition, though not shown, the trench 231 may also be formed to pass through a top portion of the first carrier 20 while passing through the substrate 210 and the encapsulant 230. Therefore, the substrate 210 can be said to have been cut into several local substrates 210'. Accordingly, each set of the electronic devices 121 and 125 on the local substrate 210' is substantially separated into an individual semiconductor package. However, since the first carrier 20 is positioned under the encapsulant 230, the local substrates 210' are held on the first carrier 20.

Figure 3D:
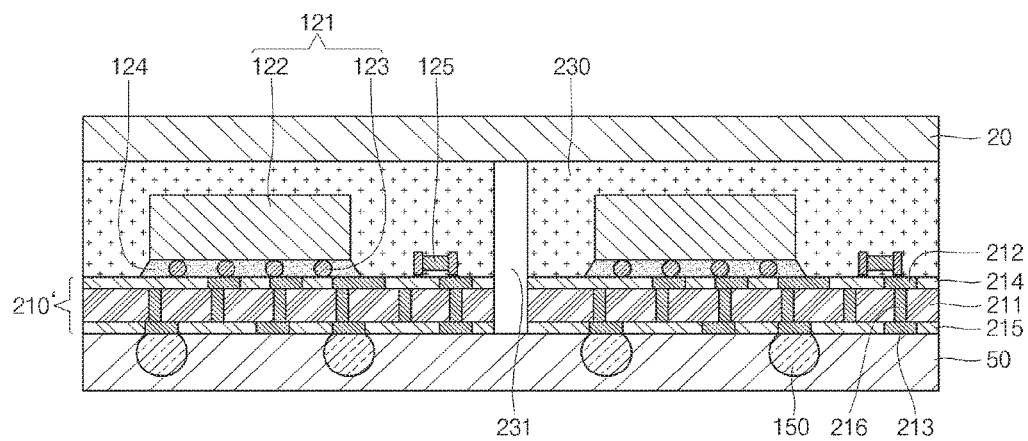
Figure 3E:
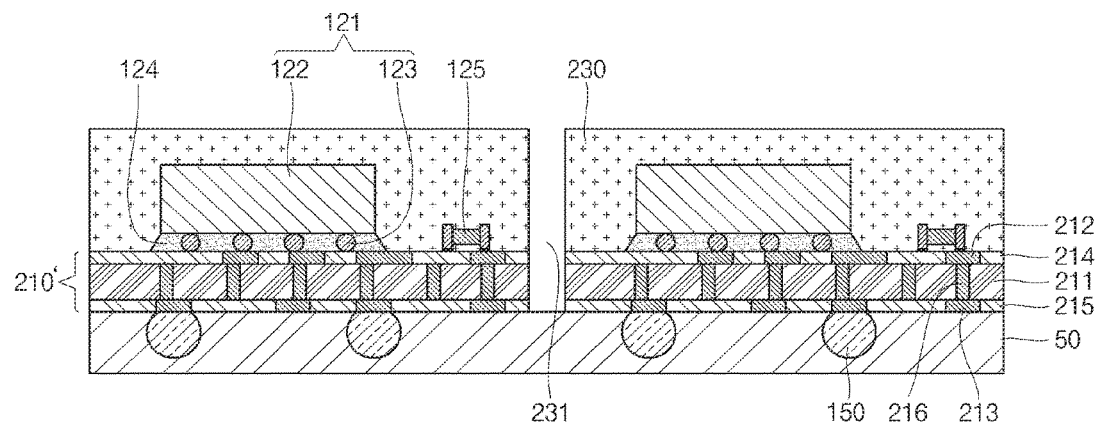

Next, as illustrated in FIG. 3D, an adhesion member 50 is attached to a bottom surface of the local substrates 210' having the conductive bumps 150 formed thereon. The adhesion member 50 may be formed as an epoxy-type adhesive tape, a layer of adhesive, etc. Therefore, the conductive bumps 150, which are positioned on the bottom surface of the local substrates 210', are now enclosed by the adhesion member 50. Next, as illustrated in FIG. 3E, the first carrier 20 is removed. Here, since the adhesion member 50 is attached to a bottom portion of the local substrates 210' even after the first carrier 20 is removed, the local substrates 210' are not separated (e.g., their spatial arrangement is maintained).

Figure 3F:
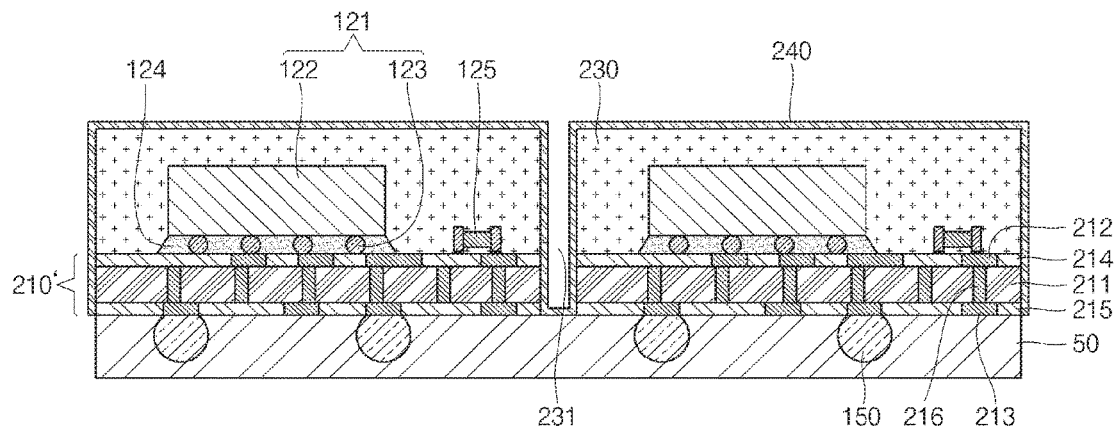

Next, as illustrated in FIG. 3F, in the forming of a shielding layer, the shielding layer 240 is formed on an upper surface and side surfaces of the encapsulant 230, the walls of the trench 231 (e.g., including side walls, a bottom surface, etc.), and the side surfaces of the local substrates 210'. The walls of the trench 231 may also be considered as side surfaces of the encapsulant 230. The side surfaces of the local substrates 210' and/or the walls of the trench 231 may be substantially vertical. However, the side surfaces and/or the walls may have other shapes and/or orientation such as, for example, slanted, stepped, curved, etc. The shielding layer 240 and/or the forming thereof may share any or all characteristics with the shielding layer 140 and/or the forming thereof, discussed herein.

Figure 3G:
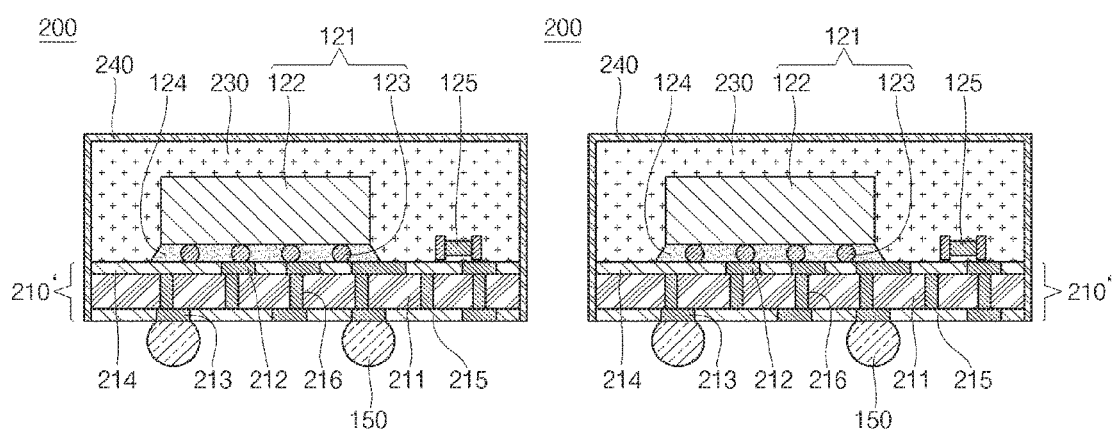

Here, the shielding layer 240 may be electrically connected to the portions of the first and/or second circuit patterns 212 and 213 that are connected to a ground of the local substrate 210'. Therefore, the shielding layer 240 may shield the encapsulant 230 to prevent electromagnetic waves generated from at least one of the electronic devices 121 and 125 in the encapsulant 230 from being emitted to the outside. In addition, the shielding layer 240 may also shield the encapsulant 230 from being exposed to externally generated electromagnetic waves. Finally, as illustrated in FIG. 3G, the adhesion member 50 is removed, thereby completing the individual semiconductor packages 200. The adhesion member 50 may be removed in any of a variety of manners (e.g., peeling, chemically dissolving, thermally releasing, etc.).

The semiconductor package 200 formed by the aforementioned fabricating method includes the local substrate 210', the electronic devices 121 and 125 attached to top portion of the local substrate 210', the encapsulant 230 encapsulating the electronic devices 121 and 125, the shielding layer 240 formed on the surface of the encapsulant 230 and on lateral side surfaces of the local substrate 210', and the conductive bumps 150 attached to bottom portion of the local substrate 210'.

Various embodiments have been described where two electronic devices 121 and 125 are mounted on a substrate for a semiconductor package 100 or 200. However, the embodiments need not be so limited. For example, there may be one semiconductor device (or other electronic device) mounted for a semiconductor package or multiple semiconductor devices (or other electronic devices) mounted for a semiconductor package.

While various embodiments have been described as comprising multi-level or multi-layer devices, an embodiment may comprise single layer devices. For example, an embodiment may comprise any number of each of a single-layer dielectric structure, a single-layer conductive structure, etc.

As described above, while the semiconductor package and the fabricating method thereof have been described for various embodiments of the present disclosure, it will be understood by those skilled in the art that modifications and changes may be made, and, accordingly, the described embodiments should be considered in all respects as only illustrative and not restrictive. The scope of the present disclosure should be defined by the appended claims rather than by the disclosure of the description of the present disclosure and all possible changes and modifications may be made without departing from the scope of the disclosure.

What is claimed:

1. A method of fabricating a semiconductor package, comprising:
    forming a substrate, comprising:
        forming a first substrate part on a support layer, the first substrate part including a first conductive structure and a first dielectric structure;
        attaching a first carrier to a top portion of the first substrate part;
        removing the support layer; and
        forming a second substrate part on the first substrate part, the second substrate part including a second conductive structure and a second dielectric structure;
    attaching a first semiconductor device to a top portion of the substrate;
    encapsulating the first semiconductor device using an encapsulant;
    forming a trench in the encapsulant; and
    forming a shielding layer on a surface of the encapsulant.

2. The method according to claim 1, comprising:
    after forming the shielding layer, attaching a second carrier to the shielding layer formed on a top side of the encapsulant;
    removing the first carrier; and
    forming conductive bumps on the first substrate part.

3. The method according to claim 2, comprising attaching a second semiconductor device having a smaller height than the conductive bumps to the first substrate part.

4. The method according to claim 1, wherein the trench is formed to pass through the encapsulant and the substrate.

5. The method according to claim 1, wherein the shielding layer is formed on a top surface of the encapsulant, side surfaces of the encapsulant, and side surfaces of the substrate.

6. The method according to claim 1, wherein the shielding layer is electrically connected to a ground of the substrate.

7. The method according to claim 1, wherein the substrate is a printed circuit board having a core.

8. The method according to claim 1, comprising, after the encapsulating, forming conductive bumps on the substrate.

9. The method according to claim 8, comprising:
attaching a carrier to a top portion of the encapsulant; and
forming the trench to pass through the substrate and the encapsulant.

10. The method according to claim 9, comprising prior to forming the shielding layer:
attaching an adhesion member to the substrate to enclose the conductive bumps; and
removing the carrier.

11. A method of fabricating a semiconductor package, comprising:
forming a first substrate part on a support layer;
attaching a semiconductor device to a top side of the first substrate part;
encapsulating the semiconductor device using an encapsulant;
forming a trench in the encapsulant;
forming a shielding layer on a top surface of the encapsulant; and
forming a second substrate part on the first substrate part, comprising:
attaching a carrier on the shielding layer; and
removing the support layer,
wherein the second substrate part comprises a conductive structure and a dielectric structure.

12. The method according to claim 11, wherein forming the first substrate part comprises forming the first substrate part including a conductive structure and a dielectric structure.

13. The method according to claim 11, wherein forming the trench comprises forming the trench to pass through the encapsulant, the first substrate part, and a portion of the support layer.

14. The method according to claim 11, comprising injecting a photoresist material into the trench.

15. The method according to claim 11, comprising, after forming the second substrate part, forming conductive bumps on the second substrate part.

16. A method of fabricating a semiconductor package, comprising:
forming a substrate;
attaching a first semiconductor device to a top portion of the substrate;
encapsulating the first semiconductor device using an encapsulant;
after the encapsulating forming conductive bumps on the substrate;
attaching a carrier to a top portion of the encapsulant;
forming a trench to pass through the substrate and the encapsulant; and
forming a shielding layer on a surface of the encapsulant.

17. The method according to claim 16, wherein the shielding layer is formed on a top surface of the encapsulant, side surfaces of the encapsulant, and side surfaces of the substrate.

18. The method according to claim 16, wherein the shielding layer is electrically connected to a ground of the substrate.

19. The method according to claim 16, wherein the substrate is a printed circuit board having a core.

20. The method according to claim 16, comprising prior to forming the shielding layer:
attaching an adhesion member to the substrate to enclose the conductive bumps; and
removing the carrier.

* * * * *